United States Patent
Kokubun

(10) Patent No.: US 9,899,434 B1
(45) Date of Patent: Feb. 20, 2018

(54) LIGHT-RECEIVING DEVICE HAVING AVALANCHE PHOTODIODES OF DIFFERENT TYPES

(71) Applicant: KABUSHIKI KAISHA TOSHIBA, Tokyo (JP)

(72) Inventor: Koichi Kokubun, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/448,542

(22) Filed: Mar. 2, 2017

(30) Foreign Application Priority Data

Aug. 26, 2016 (JP) .................................. 2016-165666

(51) Int. Cl.
| H01L 31/00 | (2006.01) |
| H01L 27/144 | (2006.01) |
| H01L 31/107 | (2006.01) |
| H01L 31/028 | (2006.01) |
| H01L 31/02 | (2006.01) |
| H01L 27/146 | (2006.01) |

(52) U.S. Cl.
CPC .... *H01L 27/1446* (2013.01); *H01L 27/14609* (2013.01); *H01L 31/028* (2013.01); *H01L 31/02027* (2013.01); *H01L 31/107* (2013.01); *H01L 2224/131* (2013.01); *H01L 2924/12043* (2013.01)

(58) Field of Classification Search
CPC . H01L 31/107; H01L 29/00; H01L 27/14609; H01L 2224/131; H01L 31/02027; H01L 2924/12043
See application file for complete search history.

(56) References Cited

U.S. PATENT DOCUMENTS

| 5,744,849 A | 4/1998 | Sugawa |
| 6,720,589 B1* | 4/2004 | Shields .................. B82Y 10/00 257/14 |
| 2014/0263975 A1* | 9/2014 | Nagano ................. H01L 27/144 250/208.2 |

(Continued)

FOREIGN PATENT DOCUMENTS

| JP | 2977164 B2 | 11/1999 |
| JP | 4763620 B2 | 8/2011 |

(Continued)

*Primary Examiner* — Ngan Ngo
(74) *Attorney, Agent, or Firm* — Patterson & Sheridan, LLP

(57) ABSTRACT

A light-receiving device includes a silicon semiconductor substrate, a plurality of first serial connections each of which includes a first avalanche photodiode (APD) and a first resistor connected in series, and a plurality of second serial connections each of which includes a second avalanche photodiode (APD) and a second resistor connected in series. The first APDs and the first resistors are formed on the silicon semiconductor substrate, and the first APDs is formed of silicon. The second APDs and the second resistors are formed on the silicon semiconductor substrate, and the second APDs is formed of a material having a smaller band gap than silicon. The plurality of first and second serial connections is connected in parallel between an anode terminal and a cathode terminal.

20 Claims, 6 Drawing Sheets

(56) References Cited

U.S. PATENT DOCUMENTS

| | | | | |
|---|---|---|---|---|
| 2014/0327100 | A1* | 11/2014 | Nagano | ............... H01L 27/1446 257/438 |
| 2016/0079464 | A1 | 3/2016 | Sasaki et al. | |
| 2016/0181293 | A1* | 6/2016 | McGarvey | .......... H01L 27/1446 257/290 |
| 2017/0236852 | A1* | 8/2017 | McGarvey | .......... H01L 27/1446 257/438 |

FOREIGN PATENT DOCUMENTS

| | | |
|---|---|---|
| JP | 2011155248 A | 8/2011 |
| JP | 2016062996 A | 4/2016 |
| WO | 2005072612 A1 | 8/2005 |

\* cited by examiner

LIGHT-RECEIVING DEVICE HAVING AVALANCHE PHOTODIODES OF DIFFERENT TYPES

CROSS-REFERENCE TO RELATED APPLICATION

This application is based upon and claims the benefit of priority from Japanese Patent Application No. 2016-165666, filed on Aug. 26, 2016, the entire contents of which are incorporated herein by reference.

FIELD

Embodiments described herein relate generally to a light-receiving device including avalanche photodiodes.

BACKGROUND

A light-receiving device of one type includes a plurality of serial connections, each including a quenching resistor and an avalanche photodiode (APD) connected in parallel. The light-receiving device measures the number of incident photons using the APDs. The light-receiving device is typically referred to as "SiPM (Silicon Photomultiplier)" since the APDs are formed of silicon (Si).

It is expected to employ the light-receiving device having the APDs in an automatic operation (driving) system so that light reflected by an object can be measured for measuring a distance to the object. The APD formed of silicon, however, has low sensitivity to long-wavelength light. On the other hand, the cost of the light-receiving device would increase if the light-receiving device is formed of a semiconductor material so as to detect the long-wavelength light. It is desirable to provide a light-receiving device capable of detecting long-wavelength light with high sensitivity and lower cost.

DETAILED DESCRIPTION

An embodiment provides a light-receiving device capable of detecting long-wavelength light with high sensitivity and lower cost.

In general, according to an embodiment, a light-receiving device includes a silicon semiconductor substrate, a plurality of first serial connections each of which includes a first avalanche photodiode (APD) and a first resistor connected in series, and a plurality of second serial connections each of which includes a second avalanche photodiode (APD) and a second resistor connected in series. The first APDs and the first resistors are formed on the silicon semiconductor substrate, and the first APDs is formed of silicon. The second APDs and the second resistors are formed on the silicon semiconductor substrate, and the second APDs is formed of a material having a smaller band gap than silicon. The plurality of first and second serial connections is connected in parallel between an anode terminal and a cathode terminal.

Light-receiving devices according to embodiments will be described hereinafter in detail with reference to the accompanying drawings. Note that the embodiments given below are not intended to limit the present disclosure.

First Embodiment

Figure 1:
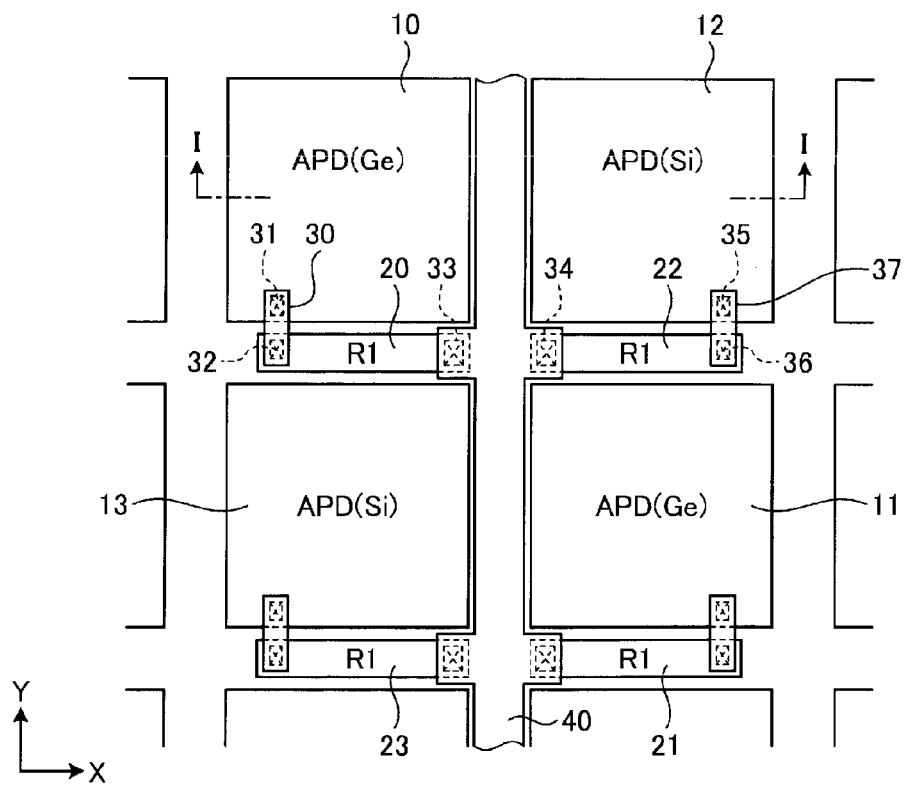
FIG. 1 is a top plan view of a part of a light-receiving device according to a first embodiment.

FIG. 1 is a top plan view of a part of a light-receiving device according to a first embodiment. The light-receiving device according to the first embodiment includes photoelectric transducers 10 to 13 that are selectively formed on a principal surface of a silicon semiconductor substrate (not shown). Upon detecting photons, each of the photoelectric transducers 10 to 13 outputs a detection signal amplified thereby. The photoelectric transducers 10 to 13 are selectively formed on an XY planar surface of the silicon semiconductor substrate in a matrix layout. The photoelectric transducers 12 and 13 are formed of Si. In contrast, the photoelectric transducers 10 and 11 are formed of a semiconductor material, for example, germanium (Ge) smaller in band gap than Si. An anode region and a cathode region (not shown) forming a PN junction of the photoelectric transducer are formed of either Si or Ge.

In FIG. 1, the photoelectric transducers formed of either Si or Ge are arranged in a staggered pattern. In other words, the Ge photoelectric transducers 10 and 11 and the Si photoelectric transducers 12 and 13 are alternately arranged in X-axis and Y-axis directions.

Each of the photoelectric transducers 10 to 13 is an APD that operates in a Geiger mode. In the Geiger mode, an inverse bias voltage higher than a breakdown voltage is applied between an anode and a cathode of the APD.

Quenching resistors 20 to 23 are connected to the photoelectric transducers 10 to 13, respectively. In other words, one end of the quenching resistor 20 is electrically connected to the anode of the photoelectric transducer 10 through an interconnect 30 while the other end thereof is connected to an anode interconnect 40. Each of the quenching resistors 20 to 23 operates to terminate the amplification action of the APD by voltage drop if the photons are incident on the APD and an electron avalanche occurs. Resistance values of the quenching resistors 20 to 23 may be same or different and are set, for example, to approximately several hundred kΩ. The quenching resistors 20 to 23 are formed of, for example, polycrystalline silicon.

Figure 2:
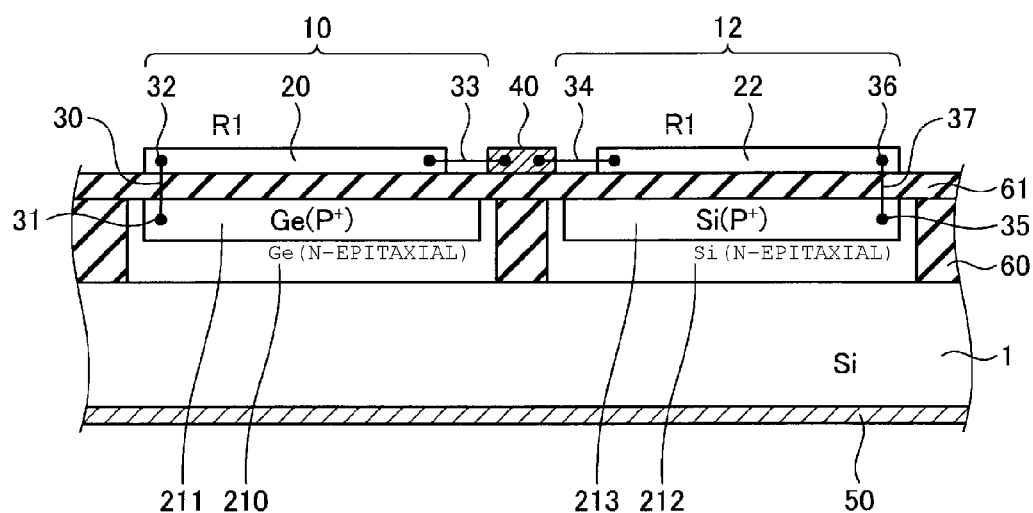
FIG. 2 is a side plan view of the part of the light-receiving device according to the first embodiment.

FIG. 2 schematically illustrates a cross-sectional structure of the light-receiving device according to the first embodiment taken along I-I in FIG. 1. A silicon semiconductor substrate 1 has a principal surface (one surface) on which the photoelectric transducers 10-13 are formed and has a back surface (the other surface) on which a cathode interconnect 50 is formed. The Ge photoelectric transducer 10 includes an N—Ge epitaxial layer 210 that is selectively formed on the principal surface of the silicon semiconductor substrate 1.

The Ge epitaxial layer 210 includes a P—Ge region 211. The Ge epitaxial layer 210 and the Ge region 211 form a PN junction of the photoelectric transducer 10.

The Si photoelectric transducer 12 includes an N—Si epitaxial layer 212 that is selectively formed on the principal surface of the silicon semiconductor substrate 1. The Si epitaxial layer 212 includes a P—Si region 213. The Si epitaxial layer 212 and the Si region 213 form a PN junction of the photoelectric transducer 12. A silicon oxide film 60 defines a region where the Ge epitaxial layer 210 and the Si epitaxial layer 212 are formed. A silicon oxide film 61 is formed, as a protective film, on a surface of each of the photoelectric transducers 10 and 12.

The Ge region 211 is electrically connected to one end of the quenching resistor 20 through the interconnect 30. One end of the interconnect 30 is connected to the Ge region 211 by a connection section 31 formed in the silicon oxide film 61 while the other end thereof is connected to one end of the quenching resistor 20 by a connection section 32. The connection sections 31 and 32 are formed from, for example, a through-hole into which a metal material is filled. The interconnect 30 is illustrated such that the interconnect 30 contains the connection sections 31 and 32. The other end of the quenching resistor 20 is electrically connected to the anode interconnect 40 by a connection section 33.

The Si region 213 is electrically connected to one end of the quenching resistor 22 through an interconnect 37. One end of the interconnect 37 is connected to the Si region 213 by a connection section 35 formed in the silicon oxide film 61 while the other end thereof is connected to one end of the quenching resistor 22 by a connection section 36. The interconnect 37 is illustrated such that the interconnect 37 contains the connection sections 35 and 36. The other end of the quenching resistor 22 is electrically connected to the anode interconnect 40 by a connection section 34. While the quenching resistors 20 and 22 are formed in peripheral edge portions of the Ge epitaxial layer 210 and the Si epitaxial layer 212, respectively, the quenching resistors 20 and 22 are illustrated to be provided above the epitaxial layers 210 and 212 in FIG. 2 for the sake of convenience.

Figure 3:
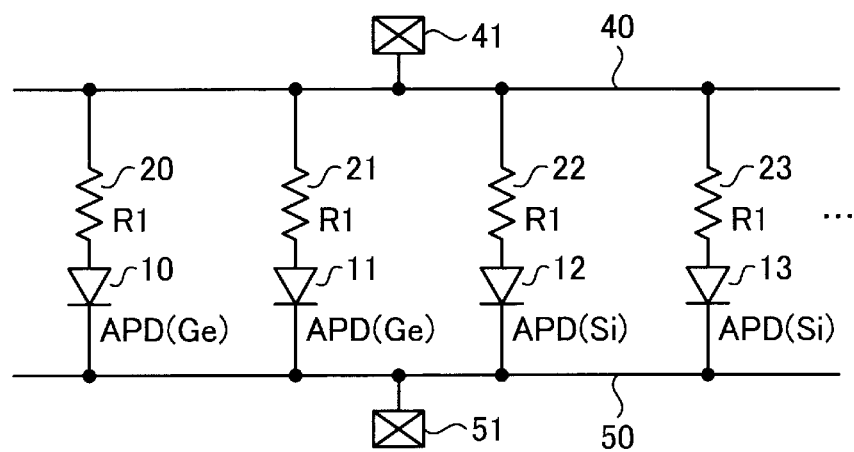
FIG. 3 is an equivalent circuit diagram of the part of the light-receiving device according to the first embodiment.

FIG. 3 is an equivalent circuit diagram of the light-receiving device according to the first embodiment. The light-receiving device is configured such that series-connected pairs of the quenching resistors and the photoelectric transducers are connected in parallel between the anode interconnect 40 and the cathode interconnect 50. Each photoelectric transducer outputs a detection signal when detecting photons. If any of the photoelectric transducers 10 to 13 connected in parallel detects photons, the detection signal obtained by the amplification action of the photoelectric transducer can be extracted from either an anode electrode 41 or a cathode electrode 51 as an addition-result detection signal.

Figure 4:
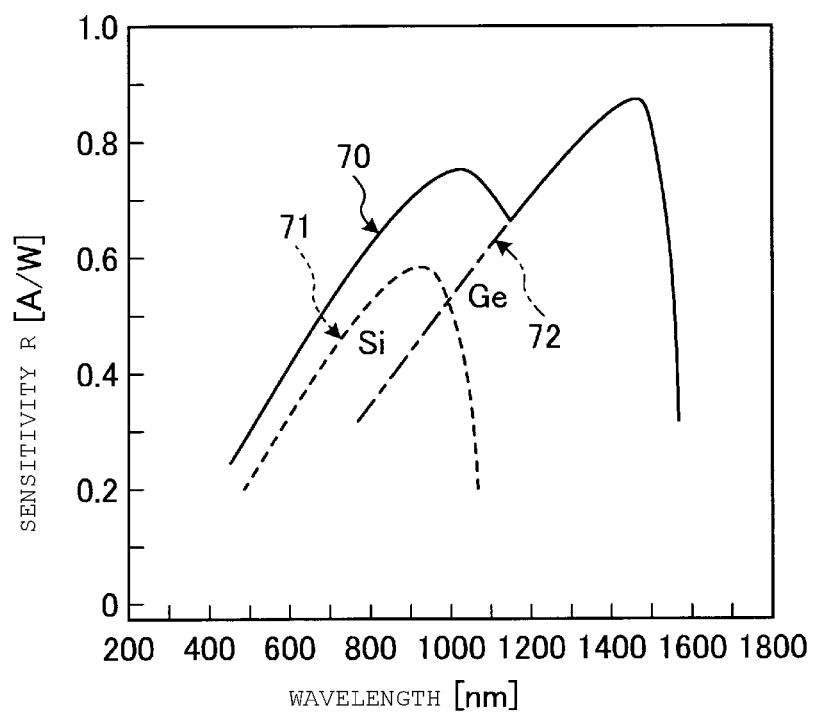
FIG. 4 depicts sensitivity characteristics of the light-receiving device according to the first embodiment.

FIG. 4 depicts characteristics of the light-receiving device according to the first embodiment. In FIG. 4, a horizontal axis denotes a wavelength of incident light and a vertical axis denotes a sensitivity R of the light-receiving device. A curve 71 indicates sensitivity characteristics of the Si photoelectric transducer and a curve 72 indicates sensitivity characteristics of the Ge photoelectric transducer. Overall sensitivity characteristics of the light-receiving device according to the present embodiment are indicated by a curve 70 obtained by integrating the curve 71 with the curve 72 since the Ge photoelectric transducers and the Si photoelectric transducers are connected in series.

In the present embodiment, the Ge photoelectric transducers and the Si photoelectric transducers are connected in series between the anode electrode 41 and the cathode electrode 51. For that reason, the light-receiving device according to the present embodiment is capable of carrying out light detection in broad wavelength ranges in which the Si photoelectric transducers and the Ge photoelectric transducers detect light. The detection using a long-wavelength light source enables the light-receiving device to carry out long-distance measurement. Furthermore, since the normally used silicon semiconductor substrate is used, it is possible to prevent cost increase. Moreover, as the Si photoelectric transducers and the Ge photoelectric transducers are arranged in a matrix layout and alternatively, it is possible to arrange the photoelectric transducers having different characteristics uniformly. It is, therefore, possible to provide uniform sensitivity characteristics.

Second Embodiment

Figure 5:
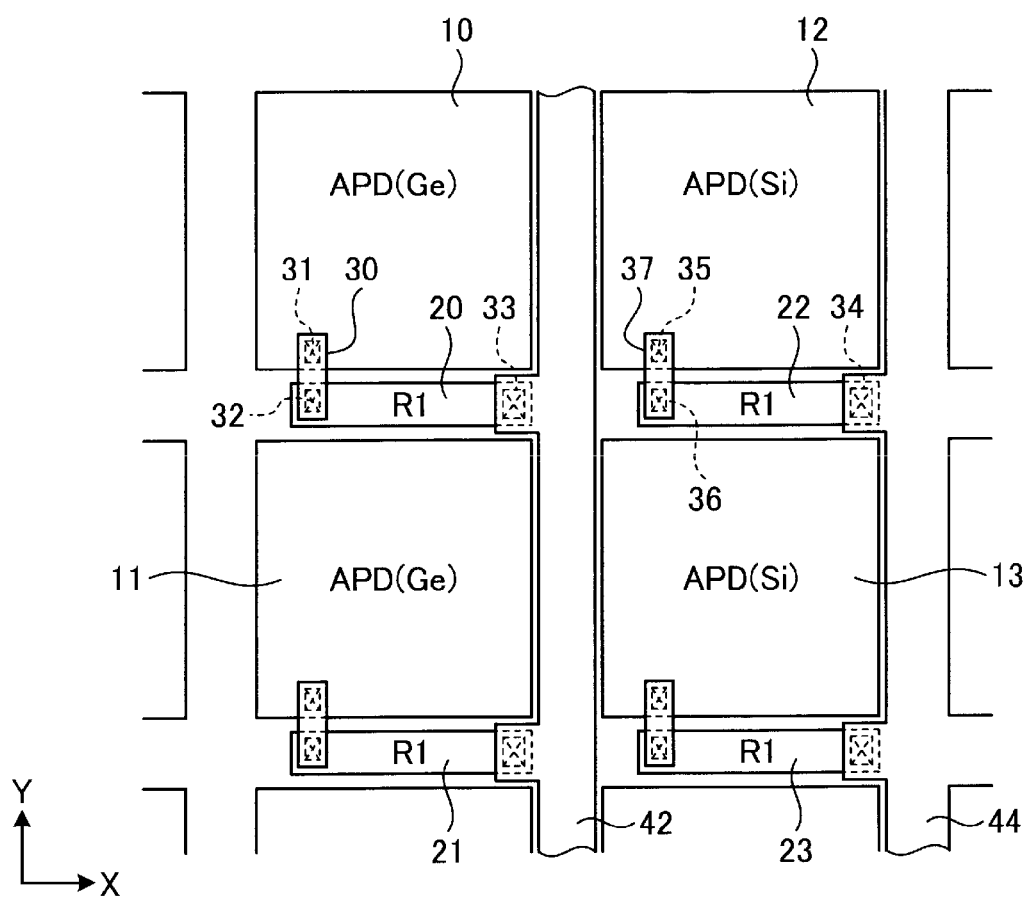
FIG. 5 is a plan view of a part of a light-receiving device according to a second embodiment.

FIG. 5 is a plan view of a part of a light-receiving device according to a second embodiment. The same signs are attached to elements corresponding to those in the first embodiment, and repetitive description will be made only as needed. In the present embodiment, the Ge photoelectric transducers 10 and 11 and the Si photoelectric transducers 12 and 13 are alternately arranged in X direction. The photoelectric transducers formed of the same semiconductor material Si or Ge are arranged in Y direction. The light-receiving device also includes a first anode interconnect 42 and a second anode interconnect 44 that connect the photoelectric transducers formed of the same semiconductor material in Y direction. The anodes of the Ge photoelectric transducers 10 and 11 are electrically connected to the first anode interconnect 42 through the quenching resistors 20 and 21, respectively. The anodes of the Si photoelectric transducers 12 and 13 are electrically connected to the second anode interconnect 44 through the quenching resistors 22 and 23, respectively.

Figure 6:
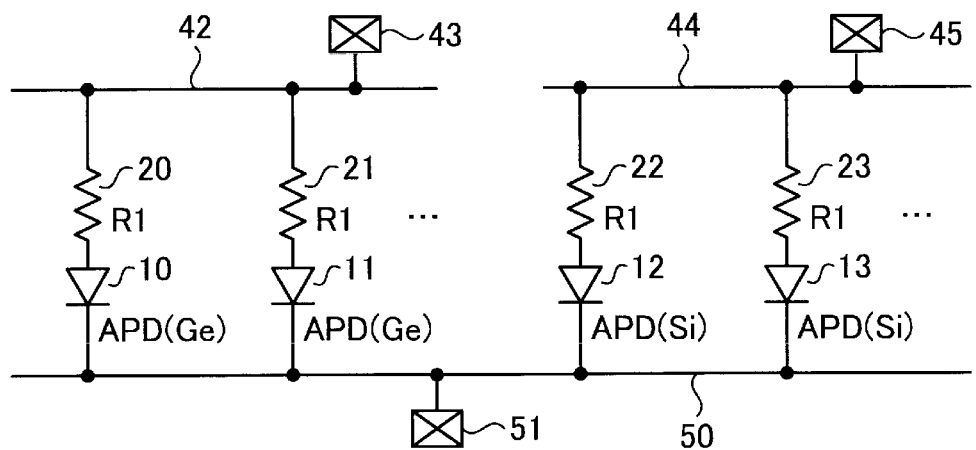
FIG. 6 is an equivalent circuit diagram of the part of the light-receiving device according to the second embodiment.

FIG. 6 is an equivalent circuit diagram of the light-receiving device according to the second embodiment. The cathodes of the photoelectric transducers 10 to 13 are connected to the cathode electrode 51 through the cathode interconnect 50. The anodes of the Ge photoelectric transducers 10 and 11 are connected to a first anode interconnect 42 through the quenching resistors 20 and 21, respectively. The first anode interconnect 42 is electrically connected to a first anode electrode 43. The anodes of the Si photoelectric transducers 12 and 13 are connected to a second anode interconnect 44 through the quenching resistors 22 and 23, respectively. The second anode interconnect 44 is electrically connected to a second anode electrode 45.

Figure 7:
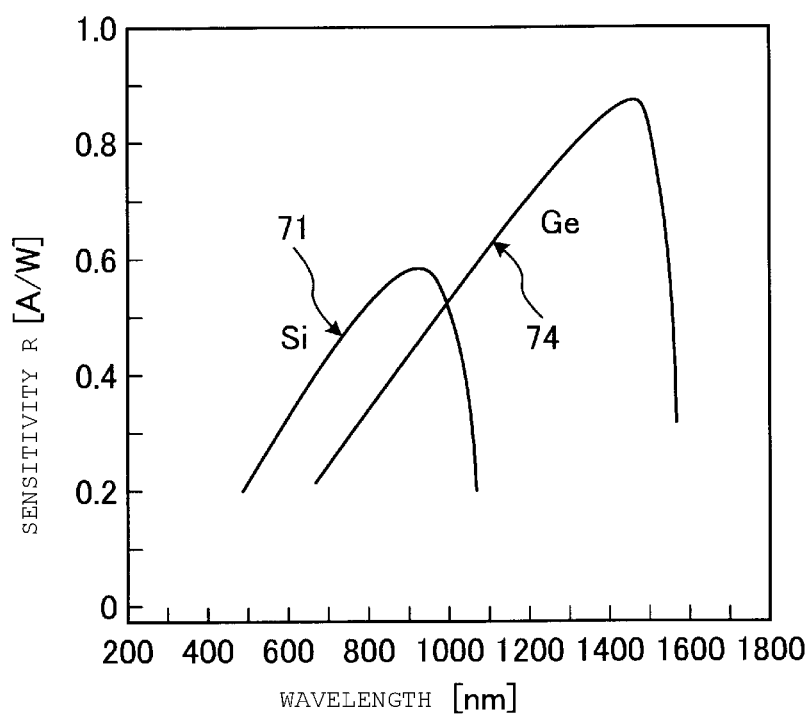
FIG. 7 depicts sensitivity characteristics of the light-receiving device according to the second embodiment.

FIG. 7 depicts characteristics of the light-receiving device according to the second embodiment. A curve 74 denotes sensitivity characteristics of the Ge photoelectric transducers 10 and 11. The curve 71 denotes sensitivity characteristics of the Si photoelectric transducers 12 and 13. The sensitivity characteristics of the light-receiving device can be changed by selecting the first anode electrode 43 or the second anode electrode 45 as appropriate. For example, if the first anode electrode 43 is selected, the light-receiving device can be activated as a light-receiving device that exhibits the sensitivity characteristics denoted by the curve 74.

In the present embodiment, the photoelectric transducers can be activated selectively by switching the anode electrodes, so that it is possible to switch the sensitivity characteristics of the light-receiving device. In other words, it is possible to select the photoelectric transducers that exhibit desired sensitivity characteristics depending on a wavelength of a light source to be used. Furthermore, it is possible to achieve the saving of power consumption by not activating all photoelectric transducers but adjusting the number of photoelectric transducers to be activated depending on the light source to be used.

Figure 8:
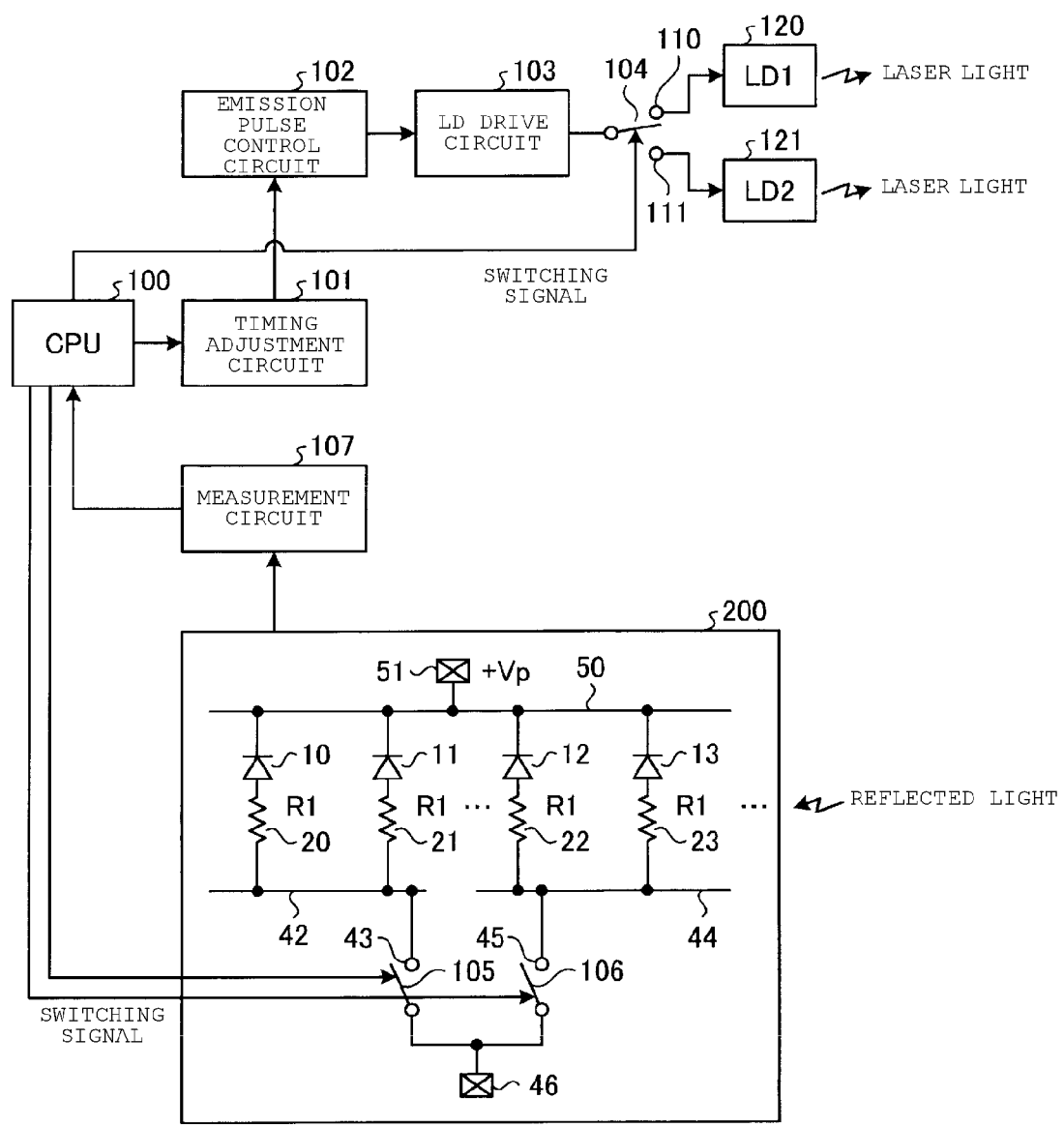
FIG. 8 is a block diagram of an optical detection system including the light-receiving device according to the second embodiment.

FIG. 8 is a block diagram of an optical detection system including the light-receiving device according to the second embodiment. The optical detection system includes a central processing unit (CPU) 100 that controls optical detection operation, a timing adjustment circuit 101, an emission pulse control circuit 102, an LD drive circuit 103, a switch 104, light emission sources 120, 121, a measurement circuit 107, and a light-receiving unit 200. The CPU 100 controls the timing adjustment circuit 101. The timing adjustment circuit 101 controls the emission pulse control circuit 102. The LD drive circuit 103 outputs a drive signal in response to an output signal from the emission pulse control circuit 102.

An output signal from the LD drive circuit 103 is selectively supplied to the first light emission source 120 or the second light emission source 121 through the switch 104. A connection terminal of the switch 104 is switched between switching terminals 110 and 111 in response to a switching signal from the CPU 100, thereby selecting either the first light emission source 120 or the second light emission source 121. The first light emission source 120 is, for example, an infrared laser diode. The second light emission source 121 is, for example, a red laser diode. By selecting either the first light emission source 120 or the second light emission source 121, it is possible to emit light at different wavelengths.

The light is emitted from the first light emission source 120 or the second light emission source 121, and reflected light reflected by an object to be measured is detected by the light-receiving unit 200. If the light-receiving unit 200 detects photons, the photons are amplified by each of the photoelectric transducers 10 to 13 operating in the Geiger mode and output as the detection signal. For example, the light-receiving unit can detect a voltage drop generated in a resistor (not shown) connected to the cathode electrode 51 or an anode electrode 46, and output the detection signal. The detection signal is supplied to the measurement circuit 107.

In the present system, the light-receiving device according to the second embodiment is used as the light-receiving unit 200. A high-potential voltage Vp is applied to the cathode electrode 51. Switches 105 and 106 are provided between the first anode electrode 43 and the anode electrode 46 and between the second anode electrode 45 and the anode electrode 46, respectively. The first anode electrode 43 or the second anode electrode 45 is selected by switching between the switches 105 and 106 and the selected anode electrode is connected to the anode electrode 46. In other words, by selecting either the first anode electrode 43 or the second anode electrode 45, it is possible to selectively activate the Ge photoelectric transducers 10 and 11 and the Si photoelectric transducers 12 and 13. The first anode electrode 43 or the second anode electrode 45 is selected under control of the switching signal from the CPU 100.

The present system switches between the first light emission source 120 and the second light emission source 121 depending on, for example, a distance to be measured, and selects the photoelectric transducers to be activated in the light-receiving unit 200 in response to the switchover. In other words, the sensitivity characteristics of the light-receiving unit 200 changes depending on the wavelength of the light emission source to be used, so that it is possible to ensure the measurement with high sensitivity. Furthermore, by selectively activating the photoelectric transducers in the light-receiving unit 200, it is possible to achieve the saving of power consumption. Alternatively, the system can be configured such that both the first anode electrode 43 and the second anode electrode 45 are connected to the anode electrode 46 by the switches 105 and 106, and both of the Ge photoelectric transducers 10 and 11 and the Si photoelectric transducers 12 and 13 are activated.

Figure 9A:
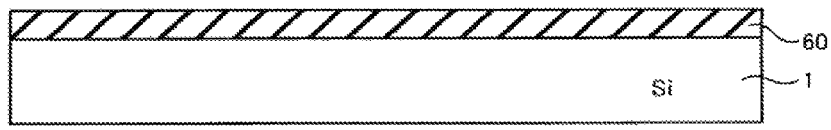
FIGS. 9A through 9F illustrate a method of manufacturing the light-receiving device according to the embodiments.
Figure 9B:
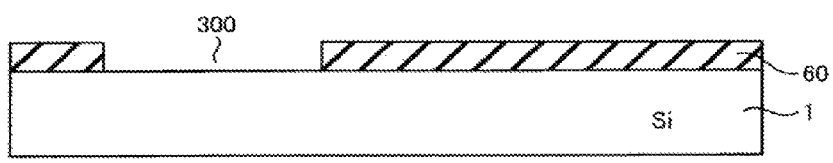

FIGS. 9A through 9F illustrate a method of manufacturing the light-receiving device according to the embodiments. On the principal surface of the silicon semiconductor substrate 1, the silicon oxide film 60 is formed by, for example, Chemical Vapor Deposition (CVD) (FIG. 9A). On the principal surface of the silicon semiconductor substrate 1, an isolation region (not shown) mutually isolating the photoelectric transducers may be formed by, for example, Local Oxidation of Silicon (LOCOS) before the silicon oxide film 60 is formed. An opening 300 is selectively formed in the silicon oxide film 60 (FIG. 9B). The opening 300 is formed in regions where the photoelectric transducers are to be formed.

Figure 9C:
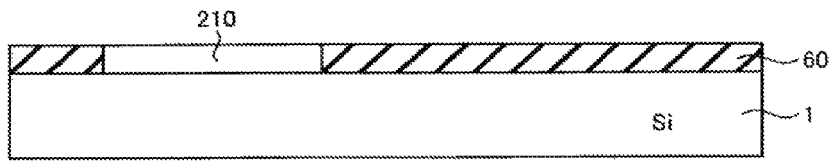

The N—Ge epitaxial layer 210 is selectively formed on the principal surface of the silicon semiconductor substrate 1 exposed in the opening 300 by, for example, the CVD method (FIG. 9C). For example, it is possible to use hydrogen as carrier gas, germane (GeH4), and arsine (AsH3) or phosphine (PH3) as N-doping gas.

Figure 9D:
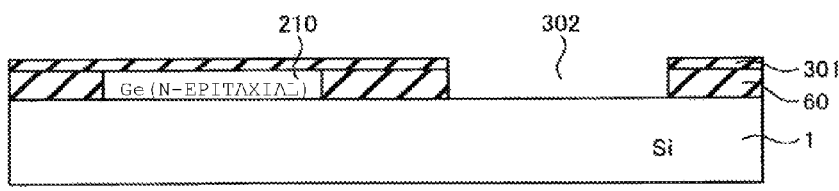

After a silicon oxide film 301 is formed on a surface of the selectively-formed N—Ge epitaxial layer 210, an opening 302 is formed in the silicon oxide film 60 and a silicon oxide film 301 (FIG. 9D). The opening 302 is formed in regions where the Si photoelectric transducers are to be formed.

Figure 9E:
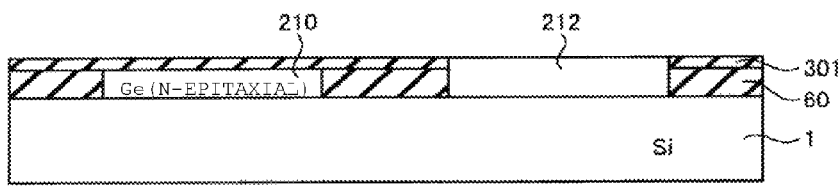

The N—Si epitaxial layer 212 is selectively formed on the principal surface of the silicon semiconductor substrate 1 exposed by the opening 302 by, for example, the CVD method (FIG. 9E). It is possible to use hydrogen (H2) as carrier gas, dichlorosilane (SiH2Cl2) and hydrogen chloride (HCl), for example, as gas species, and arsine (AsH3) as N-doping gas.

Figure 9F:
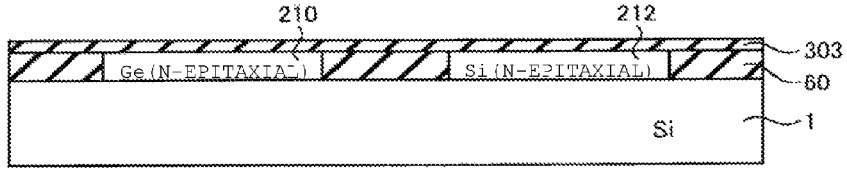

A silicon oxide film 303 is formed on surfaces of the N—Ge epitaxial layer 210 and the N—Si epitaxial layer 212 by, for example, the CVD method (FIG. 9F). Note that the silicon oxide film 303 is illustrated such that the silicon oxide film 303 contains the silicon oxide film 301.

Subsequently, processes of implantation of P-impurity ions, for example, boron ions into the N—Ge epitaxial layer 210 and the N—Si epitaxial layer 212, heat treatment for activating ion-implanted impurity regions, formation of the quenching resistors 20 to 23, and formation of electrode interconnects, and the like are carried out.

Semiconductor materials such as SiGe or InGaAs may be used as the semiconductor material smaller in band gap than Si. Alternatively, photoelectric transducers formed of a combination of these semiconductor materials may be combined as appropriate. Regions of these semiconductor materials can be similarly formed on the surface of the silicon semiconductor substrate by selective epitaxial growth. Alternatively, a silicon semiconductor substrate, on a surface on which Si epitaxial layers are formed, may be used. In this case, photoelectric transducers formed of Si may be formed by selectively exposing the Si epitaxial layers formed on the surface of the silicon semiconductor substrate and implanting predetermined impurities into the exposed epitaxial layers. Furthermore, a P-silicon semiconductor substrate may be used as the silicon semiconductor substrate. In this case, photoelectric transducers can be similarly configured by changing a conductivity type of each of the selectively formed photoelectric transducers from a P type to an N type. In this case, an anode electrode is connected to the silicon semiconductor substrate as a common electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-receiving device comprising:
   a silicon semiconductor substrate;
   a plurality of first serial connections each of which includes a first avalanche photodiode (APD) and a first resistor connected in series, the first APDs and the first resistors being formed on the silicon semiconductor substrate, and the first APDs being formed of silicon; and
   a plurality of second serial connections each of which includes a second avalanche photodiode (APD) and a second resistor connected in series, the second APDs and the second resistors being formed on the silicon semiconductor substrate, and the second APDs being formed of a material having a smaller band gap than silicon, wherein
   the plurality of first and second serial connections is connected in parallel between an anode terminal and a cathode terminal.

2. The light-receiving device according to claim 1, wherein
   the first APD and the second APD are alternately arranged in each row along a first surface direction of the silicon semiconductor substrate, and
   the first APD and the second APD are alternately arranged in each column arranged along a second surface direction of the silicon semiconductor substrate that crosses the first surface direction.

3. The light-receiving device according to claim 2, wherein
   each of the first resistors extends in the first surface direction between two APDs adjacent in the second surface direction, and
   each of the second resistors extends in the first surface direction between two adjacent APDs adjacent in the second surface direction.

4. The light-receiving device according to claim 3, further comprising:
   a plurality of wirings, each of which extends in the second surface direction, so as to connect first and second resistors arranged along adjacent two columns to one of the anode and the cathode.

5. The light-receiving device according to claim 1, wherein
   the first APD and the second APD are alternately arranged in each row along a first surface direction of the silicon semiconductor substrate, and
   one of the first APDs and the second APDs are arranged in each column along a second surface direction of the silicon semiconductor substrate that crosses the first surface direction.

6. The light-receiving device according to claim 5, wherein
   each of the first resistors extends in the first surface direction between two APDs adjacent in the second surface direction, and
   each of the second resistors extends in the first surface direction between two adjacent APDs adjacent in the second surface direction.

7. The light-receiving device according to claim 6, further comprising:
   a plurality of wirings, each of which extends in the second surface direction, so as to connect first and second resistors arranged along a same column to one of the anode and the cathode.

8. The light-receiving device according to claim 1, wherein the material of the second APD includes germanium.

9. The light-receiving device according to claim 1, wherein
   each of the first APDs includes a first epitaxial semiconductor layer of a first conductivity type formed on the silicon semiconductor substrate, and a first semiconductor layer of a second conductivity type formed on the first epitaxial semiconductor layer, and
   each of the second APDs includes a second epitaxial semiconductor layer of the first conductivity type formed on the silicon semiconductor substrate, and a second semiconductor layer of the second conductivity type formed on the second epitaxial semiconductor layer.

10. The light-receiving device according to claim 1, wherein
    the plurality of first serial connections is connected between the anode terminal and the cathode terminal via a first switch, and
    the plurality of second serial connections is connected between the anode terminal and the cathode terminal via a second switch.

11. The light-receiving device according to claim 10, further comprising:
    a control circuit configured to selectively turn on one of the first switch and the second switch.

12. The light-receiving device according to claim 1, wherein the first resistors and the second resistors are formed of a same material.

13. The light-receiving device according to claim 1, wherein the first resistors and the second resistors have a same resistance.

14. A light-receiving device comprising:
    a silicon semiconductor substrate;
    a first serial connection including a first avalanche photodiode (APD) and a first resistor connected in series, the first APD and the first resistor being formed on the silicon semiconductor substrate and the first APD being formed of silicon; and
    a second serial connection including a second avalanche photodiode (APD) and a second resistor connected in series, the second APD and the second resistor being formed on the silicon semiconductor substrate and the second APD being formed of a material having a smaller band gap than silicon, wherein
    the first serial connection and the second serial connection are connected in parallel between an anode and a cathode.

15. The light-receiving device according to claim 14, wherein the material of the second APD includes germanium.

16. The light-receiving device according to claim 14, wherein the first APD includes a first epitaxial semiconductor layer of a first conductivity type formed on the silicon semiconductor substrate, and a first semiconductor layer of a second conductivity type formed on the first epitaxial semiconductor layer, and the second APD includes a second epitaxial semiconductor layer of the first conductivity type formed on the silicon semiconductor substrate, and a second semiconductor layer of the second conductivity type formed on the second epitaxial semiconductor layer.

17. The light-receiving device according to claim 14, wherein the first serial connection is connected between the anode terminal and the cathode terminal via a first switch, and the second serial connections is connected between the anode terminal and the cathode terminal via a second switch.

18. The light-receiving device according to claim 17, further comprising:

a control circuit configured to turn on selectively one of the first switch and the second switch.

19. The light-receiving device according to claim 14, wherein the first resistors and the second resistors are formed of a same material.

20. The light-receiving device according to claim 14, wherein the first resistors and the second resistors have a same resistance.

* * * * *